(12) United States Patent
Schippers et al.

(10) Patent No.: US 11,205,469 B2
(45) Date of Patent: Dec. 21, 2021

(54) POWER DOMAIN SWITCHES FOR SWITCHING POWER REDUCTION

(71) Applicant: Micron Technology, Inc., Boise, ID (US)

(72) Inventors: Stefan Frederik Schippers, Peschiera del Garda (IT); Christophe Vincent Antoine Laurent, Agrate Brianza (IT); Corrado Villa, Sovico (IT)

(73) Assignee: Micron Technology, Inc., Boise, ID (US)

( * ) Notice: Subject to any disclaimer, the term of this patent is extended or adjusted under 35 U.S.C. 154(b) by 181 days.

(21) Appl. No.: 16/509,916

(22) Filed: Jul. 12, 2019

(65) Prior Publication Data
US 2021/0012827 A1    Jan. 14, 2021

(51) Int. Cl.
*G06F 1/3296* (2019.01)
*G11C 11/4074* (2006.01)
*G11C 11/406* (2006.01)

(52) U.S. Cl.
CPC ........ *G11C 11/4074* (2013.01); *G06F 1/3296* (2013.01); *G11C 11/406* (2013.01)

(58) Field of Classification Search
CPC .. G11C 11/4074; G11C 11/406; G06F 1/3296
See application file for complete search history.

(56) References Cited

U.S. PATENT DOCUMENTS

| | | | |
|---|---|---|---|
| 7,023,757 B2* | 4/2006 | Watanabe | G11C 11/417 365/227 |
| 8,362,827 B2* | 1/2013 | Takahashi | H03K 19/0016 327/544 |
| 10,613,617 B2* | 4/2020 | Chi | G05F 1/56 |
| 10,811,951 B1* | 10/2020 | Sharma | H03K 3/356 |
| 2008/0288800 A1* | 11/2008 | Do | G06F 1/3243 713/323 |
| 2009/0027081 A1* | 1/2009 | Kaplun | H03K 19/0948 326/58 |
| 2009/0108920 A1* | 4/2009 | Agarwal | H03K 19/0008 327/544 |
| 2016/0142049 A1* | 5/2016 | Richardson | H02M 1/088 327/109 |
| 2020/0235089 A1* | 7/2020 | Stockinger | H02H 9/046 |

* cited by examiner

*Primary Examiner* — Vincent H Tran
(74) *Attorney, Agent, or Firm* — Holland & Hart LLP

(57) ABSTRACT

Methods, systems, and devices for power domain switches for switching power reduction are described. A device, such as a memory device, may receive an indication (e.g., a command) for a power domain component of the device to transition between states. The device may float first and second gate drivers. A pass gate may be used to connect (e.g., short) the first switch to the second switch. The pass gate may be deactivated to isolate the gates. The first and second gate drivers may be enabled, and the first and second gate drivers drive the first and second switches to disconnect the power domain component from a power source to deactivate the power domain component, or connect to the power source to activate the power domain component. The energy to switch between active and inactive states may thereby be reduced.

20 Claims, 8 Drawing Sheets

POWER DOMAIN SWITCHES FOR SWITCHING POWER REDUCTION

BACKGROUND

The following relates generally to a system that includes at least one electronic device, such as a memory device, and more specifically to power domain switches for switching power reduction.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), three-dimensional crosspoint (3D XPoint), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

An electronic device, such as memory device, may include one or more power domain components that it can deactivate to save power, for example, in a power down state. To provide this functionality, the electronic device may include power domain switches that may be selectively opened or closed to supply power to the power domain component from a power source. However, these power domain switches themselves use power to drive the power domain switch. In some cases, this additional power to switch may be substantial.

DETAILED DESCRIPTION

Figure 1:
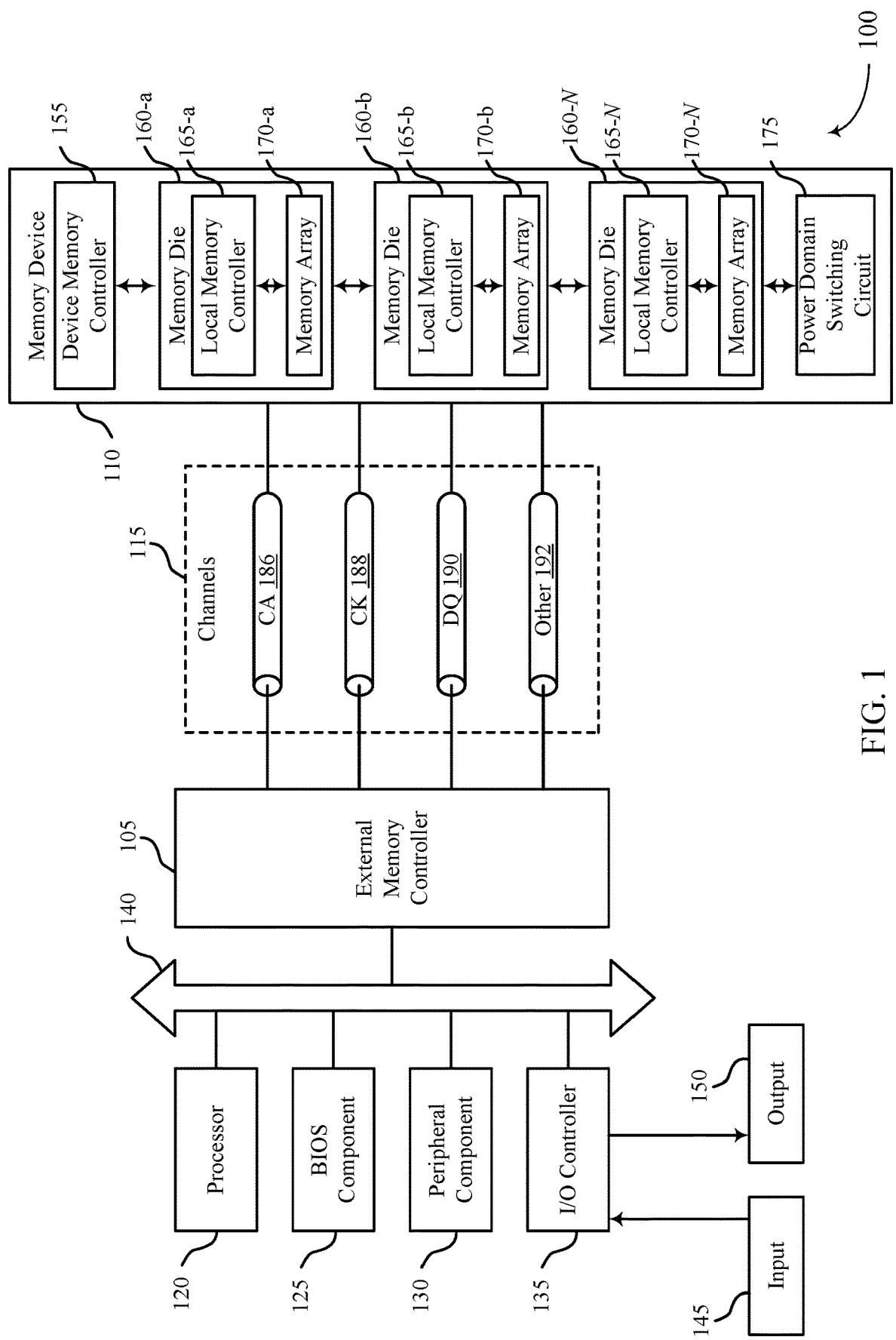
FIG. 1 illustrates an example of a system that supports power domain switches for switching power reduction in accordance with examples as disclosed herein.

An electronic device (e.g., a memory device), may operate in an inactive state (e.g., in a power down or other reduced power mode) to save power. The electronic device may also not need a particular component (or other set of circuitry) during a certain time period, and may deactivate the component in a given mode to save power. In such modes, one or more components of the electronic device may be deactivated or activated using one or more power domain switches that may cut or restore, respectively, an electrical connection between the component and a power source. These power domain switches may themselves use power to drive the power domain switch open (e.g., to cut the connection) or closed (e.g., to restore the connection), and thereby use additional power beyond what is used by the power domains themselves.

In some cases, for example for an electronic device having a large number of switched power domains, or where frequent switching between inactive and active states occurs, etc., this additional power to switch may become substantial. This additional power may degrade performance of the electronic device, for example by reducing available battery power for a portable electronic device, or increasing heat that needs to be dissipated by the electronic device, which may increase device complexity may reduce its useful operating life. As such, improved techniques for power domain switching are desired to reduce the power consumed by power domain switches and facilitate more efficient power domain switching.

A power domain switching circuit may include a first switch and a second switch that supply power to a power domain component (e.g., a block) when the power domain component is in a first state (e.g., an active state). The active state may correspond to an active mode for the power domain component, of multiple power domain components including the one power domain component. In the active state, one or more gate drivers may drive the switches to activate them, for example, such that the gate of the first switch may be held low to activate a p-type switch (e.g., where it is an p-type switch, such as a p-channel field-effect transistor (FET)), and the gate of the second switch may be held high to activate it (e.g., where it is an n-type switch, such as an n-channel FET).

As disclosed herein, the present techniques and apparatuses relate to a power domain switching circuit that may utilize a pass gate to connect (e.g., short together) a gate node of a first switch and a gate node of a second switch during a transition from the active state to the inactive state. The pass gate may also connect (e.g., short together) the gate nodes during a transition from one state to another (e.g., the inactive state to the active state). The gate drivers (e.g., buffers, or three state buffers) may be disabled to inhibit contention between or adverse effects relating to the gate drivers, and then the pass gate may be activated so that charge (e.g., current) may flow between the gates of the switches until the voltages across the gates equalizes. The pass gate may then be deactivated and the gate drivers may be enabled to drive the gates of the switches to the new activity state (active or inactive, as desired). By recovering energy stored in the gates of first switch and the second switch during the transition process using the pass gate, less energy is needed to drive the first switch and the second switch to the new activity state, thereby reducing overall power consumption and increasing efficiency, among other advantages.

The power domain switching circuits described herein may be utilized in various electronic devices where separate power domain components may be used or desired, including in memory devices. Examples of such memory devices may include, but are not limited to, devices including random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and three-dimensional crosspoint memory (3D XPoint), among others.

Features of the disclosure are initially described in the context of a memory system and memory die as described with reference to FIGS. 1 and 2. Features of the disclosure are described in the context of power domain switching circuits and timing diagrams as described with reference to FIGS. 3-6. These and other features of the disclosure are further illustrated by and described with reference to an apparatus diagram and flowcharts that relate to power domain switches for switching power reduction as described with references to FIGS. 7 and 8.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card. The host device may provide an indication for a power domain component or block to transition from an active state to an inactive state, or vice versa. In some examples, the host device may provide a command to enter an inactive state, such as a command to enter a power down state (e.g., PowerDown or SLEEP commands), or a command to enter an active state, such as a command to exit a power down state (e.g., ExitPowerDown or SLEEP_EXIT command).

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. Such components may include power domain switching circuit 300 or power domain switching circuit 500 described herein.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120. In some cases, local memory controller 165 may receive a command to enter an active state or an inactive state from a host device or the external memory controller 105. Local memory controller 165 may then provide power domain component-specific commands to one or more power domain components (e.g., power domain switching circuit 175) based on the received command.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal. In some cases, external memory controller 105 may receive a command to enter an active state or an inactive state from a host device. External memory controller 105 may then provide power domain component-specific commands to one or more power domain components (e.g., power domain switching circuit 175), or the local memory controller 165, based on the received command.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

As related to FIG. 1, the memory device 110 may include a power domain switching circuit 175 that may utilize a pass gate to connect (e.g., short together) a gate node of a first switch and a gate node of a second switch during a transition from a first state (e.g., an active state) to a second state (e.g., an inactive state). The pass gate may also connect (e.g., short together) the gate nodes during a transition from one state to another (e.g., the inactive state to the active state). One or more gate drivers (e.g., buffers, or three state buffers) may be disabled to inhibit contention between or adverse effects relating to the gate drivers, and then the pass gate may be activated so that charge (e.g., current) may flow between the gates of the switches until the voltages across the gates equalizes. The pass gate may then be deactivated and the gate drivers may be enabled to drive the gates of the switches to the new activity state (active or inactive, as desired). By recovering energy stored in the gates of first switch and the second switch during the transition process using a pass gate of a power domain switching circuit 175, less energy is needed to drive the first switch and the second switch to the new activity state, thereby reducing overall power consumption and increasing efficiency, among other advantages.

Figure 2:
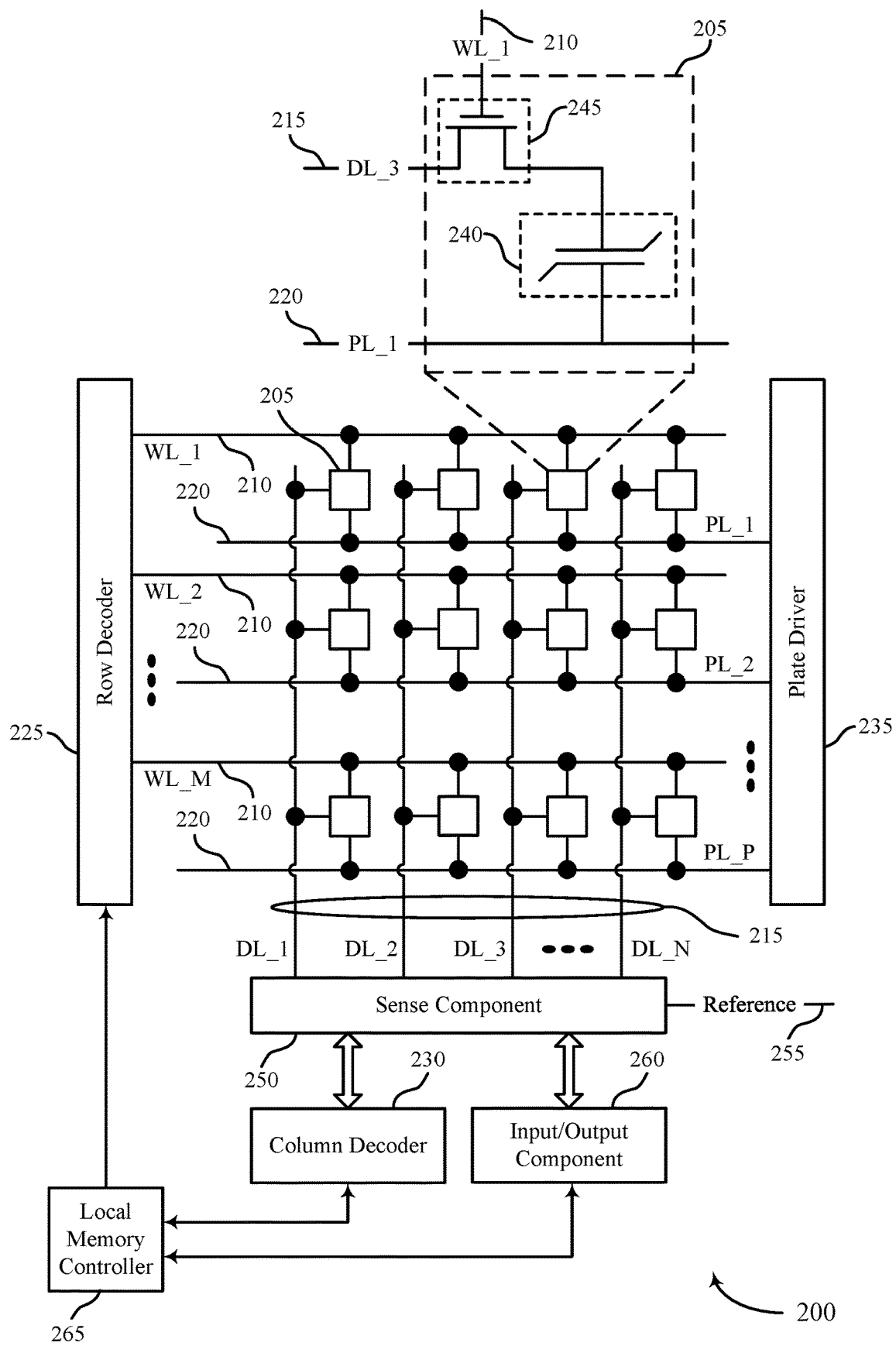
FIG. 2 illustrates an example of a memory die that supports power domain switches for switching power reduction in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that may be programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

As discussed herein, the power domain switching techniques may be applicable to various types of memory cells or devices. Examples may include, but are not limited to, devices including RAM, ROM, DRAM, SDRAM, FeRAM, MRAM, RRAM, flash memory, PCM, and 3D XPoint, among others A memory cell 205 may store a state (e.g., polarization state or dielectric charge) that represents digital data. In FeRAM architectures, the memory cell 205 may include a capacitor 240 that includes a ferroelectric material to store a charge and/or a polarization representative of the programmable state. In DRAM architectures, the memory cell 205 may include a capacitor 240 that includes a dielectric material to store a charge representative of the programmable state. In other memory architectures, a memory die 200 in accordance with the described techniques may implement other types of memory elements or storage elements. For example, a memory die 200 may include memory cells 205 with a material memory element (e.g., in place of the illustrated capacitor 240) that stores a logic state as a material property of the material memory element. Such material properties may include a programmable resistance (e.g., for a phase change material memory element that can be programmed with different resistances, in a PCRAIVI application), a programmable threshold voltage (e.g., for a material memory element that can be programmed with different threshold voltages, such as by write operations with different current pulse duration, amplitude, or polarity), and other characteristics that can be selectively programmed to store a logic state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

In some cases, the memory die 200 may receive a command indicating to transition to an active state, or to transition to an inactive state.

The memory cell 205 may include a logic storage component, such as capacitor 240 or other storage element or memory element, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. However, in various examples, memory architectures that support the described techniques may or may not include a switching component 245 as part of, or otherwise associated with a respective memory cell 205. In some cases, plate lines 220 may be coupled with a cell plate reference voltage, such as Vpl, or may be a ground or chassis ground voltage, such as Vss. In some cases, plate lines 220 may refer to a plate or electrical node that is common to all of the memory cells 205, or a plate or electrical node that is common to a subset of the memory cells 205 or a subset of plate lines, or another electrical node coupled with a plate line driver.

Selecting or deselecting the memory cell 205 may be accomplished by activating or deactivating the switching component 245, or otherwise activating relevant access lines. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation may be controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to determine a state (e.g., a polarization state or a charge) stored on the capacitor 240 of the memory cell 205 and determine a logic state of the memory cell 205 based on the detected state. The charge stored by a memory cell 205 may be relatively small, in some cases. As such, the sense component 250 may include one or more sense amplifiers to amplify the signal output of the memory cell 205. The sense amplifiers may detect small changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of the memory cell 205 may be provided as an output of the sense component 250 (e.g., to an input/output component 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, and/or the plate driver 235.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform or control a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation.

In some cases, the local memory controller 265 may be configured to perform or control a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 (e.g., a sense amplifier of the sense component 250) may amplify the signal. The local memory controller 265 may fire the sense component 250 (e.g., latch a sense amplifier of the sense component 250) and thereby compare the signal received from the memory cell 205 to the reference signal 255. Based on that comparison, the sense component 250 may determine a logic state that is stored on the memory cell 205. In some examples, the local memory controller 265 may communicate the logic state stored on the memory cell 205 to an external memory controller 105 or a device memory controller 155 as part of the read operation.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

In some examples, the memory die 200 may include one or more power domain components (blocks). These power domain components may each be associated with a power domain switching circuit that can activate or deactivate switches that control the supply of power to the power domain component (e.g., from a power source). To reduce energy consumption during the process switching, the power domain switching circuit may include a pass gate that can selectively couple a first switch (e.g., to couple the power domain component to VSS when the switch is activated) and a second switch (e.g., to couple the power domain component to VSS when the switch is activated) during a transition from one state to another (e.g., from an active state to an inactive state, from an inactive state to an active state), for the power domain component.

The gate drivers driving the switches may be floated, then the pass gate may be activated (e.g., to at least partially equalize the voltage between the gates). The pass gate activated allows charge to transfer (e.g., flow) between the gates. The pass gate may then be deactivated to isolate the gates from each other. The gate drivers may then be enabled, and the gates driven to the voltage (high or low, as needed) to effectuate the transition from the active state to the inactive state, or from the inactive state to the active state. The pass gate allows recovery of a portion of the energy from the gates, so that the gates do not use as much energy to drive them to the new state, whether active or inactive.

Figure 3:
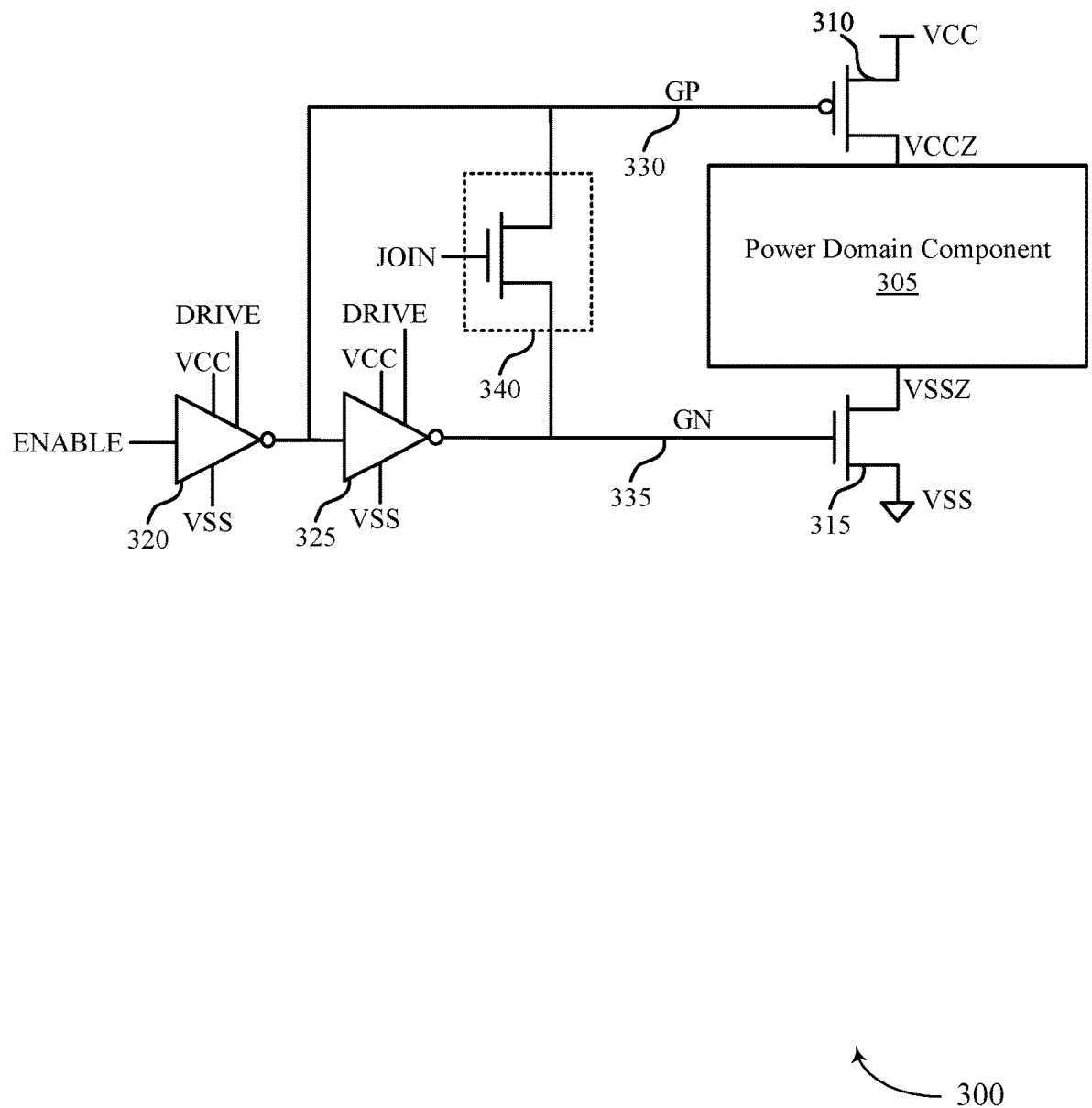
FIG. 3 illustrates an example of a power domain switching circuit that supports power domain switches for switching power reduction in accordance with examples as disclosed herein.

FIG. 3 illustrates an example of a power domain switching circuit 300 that supports power domain switches for switching power reduction in accordance with examples as disclosed herein.

Power domain component 305, which may also be referred to as a power domain block, may be any collection or set of circuits supplied with power (e.g., from the power source) via first switch 310 and second switch 315, and may include multiple different components or blocks.

Power domain switching circuit 300 may include, in some examples, a first switch 310, a second switch 315, a pass gate 340, a first gate driver 320, and a second gate driver 325. First switch 310 may be configured to couple the power domain component 305 to a power source supplying VCC at a first terminal of a device that includes power domain switching circuit 300. Second switch 315 may be configured to couple the power domain component 305 to a power source supplying VSS at a second terminal of the device that includes power domain switching circuit 300. Due to the voltage drop across first switch 310 when in an activated state, power domain component 305 may receive VCCZ. Similarly, due to the voltage drop across second switch 315 when in an activated state, power domain component 305 may receive VSSZ.

First switch 310 may in some examples be a p-type FET. Second switch 315 may in some examples be a n-type FET. Each of first switch 310 and second switch 315 may have a relatively large gate width to minimize the voltage drop between source and drain while in an activated state supplying power from the power source, for example so that VCC may be close to VCCZ and VSS may be close to VSSZ. In some examples, first switch 310 and second switch 315 may be configured relative to each other to account for differences in electron and hole mobility. For example, first switch 310 may be p-type FET and have a gate that is two or more times as large as the gate of second switch 315. Because of the relatively large gate widths, first switch 310 and second switch 315 may each have a gate capacitance that is large relative to p-type FET and n-type FET transistors implemented for digital logic, memory, or other purposes in power domain component 305 (e.g., 2 or more orders of magnitude larger gate capacitance).

The gate of first switch 310 may, in some examples, be coupled to a first terminal of pass gate 340, an output of the first gate driver 320 and an input of the second gate driver 325 via GP node 330. The gate of second switch 315 may, in some examples, be coupled to a second terminal of pass gate 340 and an output of the second gate driver 325 via GN node 335. When pass gate 340 is activated by a signal, such as a JOIN signal (e.g., the switch is closed), GP node 330 may be shorted to GN node 335, and consequently the gate of first switch 310 may be shorted to the gate of second switch 315. When pass gate 340 is deactivated, such as by the JOIN signal (e.g., the switch is opened), GP node 330 may be isolated from to GN node 335, and consequently the gate of first switch 310 may be isolated from the gate of second switch 315.

Pass gate 340 may be any gate that may connect (e.g., short) and disconnect (e.g., isolate) GP node 330 to and from GN node 335 according to one or more signals (e.g., a control signal or signals). In some examples, a single pass transistor may be used for pass gate 340, such as a single n-type FET or single p-type FET transistor, controlled by a signal. In some examples, a transmission gate having an input, output, p-gate, and n-gate may be used to provide bidirectional connectivity. The transmission gate may be controlled by a complementary set of signals. Pass gate 340 may be scaled to adjust (e.g., increase, decrease) current between GP node 330 and GN node 335. The gate of pass gate 340 may be activated or deactivated by one or more signals, such as a JOIN signal.

First gate driver 320 may drive the gate of first switch 310 (via GP node 330) to activate or deactivate first switch 310. In some examples, first gate driver 320 may be a three-state buffer whose output may be high, low, or floating (e.g., a high impedance state). The first input of first gate driver 320 may be activated or deactivated by one or more signals, such as an ENABLE signal, and the enable input of first gate driver 320 may be activated or deactivated by one or more signals, such as a DRIVE signal. First gate driver 320 may be supplied VCC and VSS from a power source.

Second gate driver 325 may drive the gate of second switch 315 (via GN node 335) to activate or deactivate second switch 315. In some examples, second gate driver 325 is a three-state buffer whose output may be high, low, or floating (e.g., a high impedance state). The first input of second gate driver 325 may be connected (via GP node 330) to the output of first gate driver 320 and the enable input of second gate driver 325 may be DRIVE. Second gate driver 325 may be supplied VCC and VSS from the power source.

Figure 4:
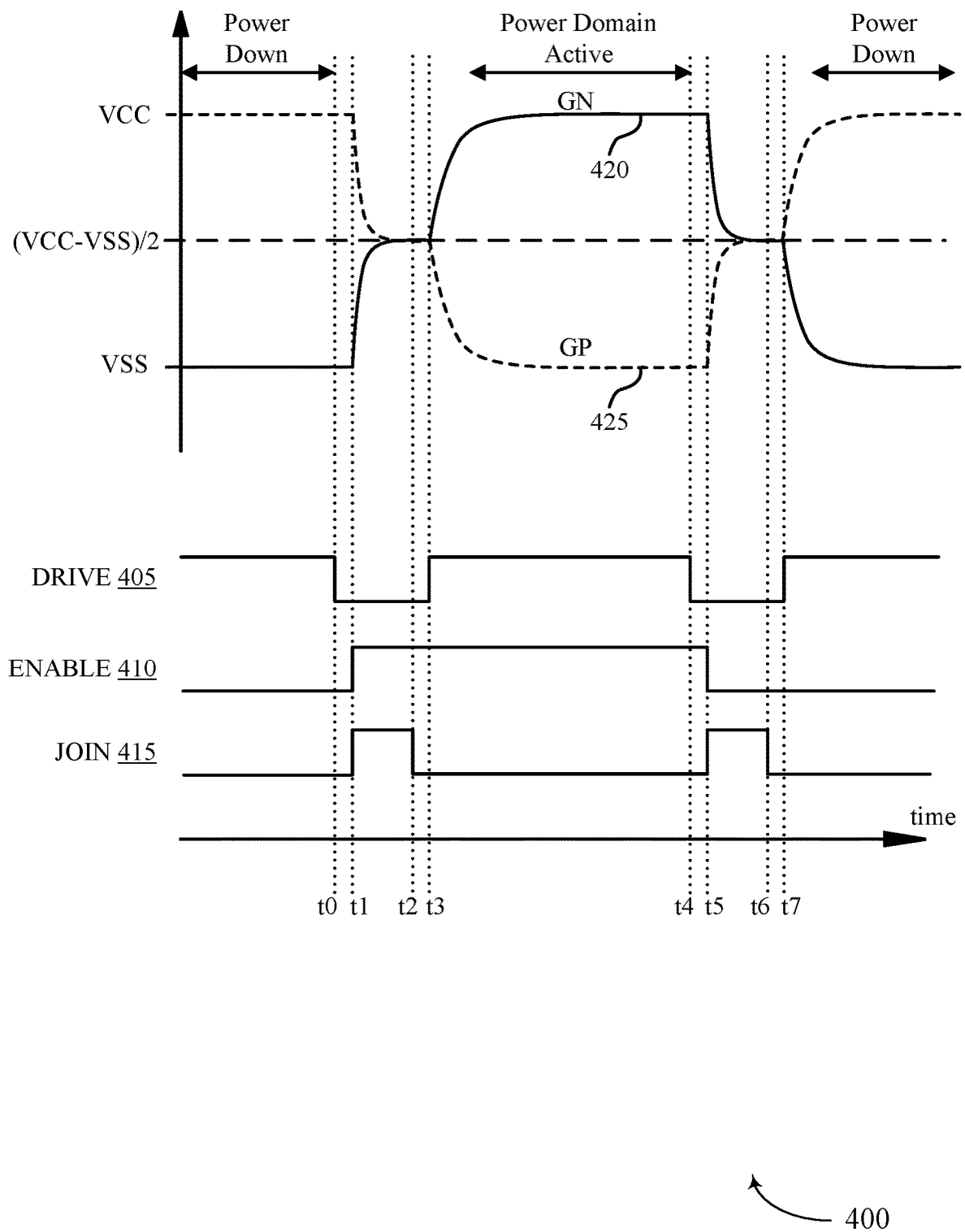
FIG. 4 illustrates an example of a timing diagram that supports power domain switches for switching power reduction in accordance with examples as disclosed herein.

FIG. 4 illustrates an example of a timing diagram 400 that supports power domain switches for switching power reduction in accordance with examples as disclosed herein. In some examples, timing diagram 400 may correspond to the operation of power domain switching circuit 300 as illustrated in and described with reference to FIG. 3. DRIVE signal 405 may correspond to a signal that activates or deactivates an input of first gate driver 320. ENABLE signal 410 may correspond to a signal that activates or deactivates an input of first gate driver 320. JOIN signal 415 may correspond to a signal that activates or deactivates an input of pass gate 340. GN waveform 420 may correspond to a waveform of GN node 335. GP waveform 425 may correspond to a waveform of GP node 330.

Before to, the power domain switching circuit 300 may be in a first state such as an inactive state, which may also be referred to as power down. In the inactive state, each of first gate driver 320 and second gate driver 325 may be enabled by DRIVE signal 405 being high. ENABLE signal 410 may be held low at the input of first gate driver 320 may hold GP node 330, which may be coupled to the gate of first switch 310, high at VCC. First switch 310 is thereby deactivated, decoupling (e.g., isolating) power domain component 305 from VCC of the power source. GP node 330 may be coupled to the input of second gate driver 325, such that ENABLE signal 410 may be held low at the input of first gate driver 320, and may hold GP node 330 high, and second gate driver 325 may hold GN node 335 low at VSS. GN node 335 may be coupled to the gate of second switch 315, which may thereby be deactivated, decoupling (e.g., isolating) power domain component 305 from VSS of the power source. Also before t0, JOIN signal 415 may be held low to decouple (e.g., isolate) GP node 330 and GN node 335.

At t0, DRIVE signal 405 may transition (e.g., from high to low), disabling each of first gate driver 320 and second gate driver 325, such that the output of first gate driver 320 may be floating (e.g., in a high impedance state) with respect to the input (the ENABLE signal 410), and the output of second gate driver 325 may be floating (e.g., in a high impedance state) with respect to the input (GP node 330). DRIVE signal 405 may be transitioned (e.g., from high to low) to disable the first gate driver 320 and the second gate driver 325 to prevent contention with the pass gate 340, for example, at $t_1$ when the JOIN signal 415 transitions (e.g., from low to high).

At $t_1$, JOIN signal 415 transitions from low to high, shorting together GP node 330 and GN node 335 via pass gate 340. Charge may be transferred between the gate of first switch 310 and the gate of second switch 315. In some examples, this charge transfer may occur until the voltages equalize (or substantially equalize), while in other cases the voltages may merely move toward each other. For example, if the load capacitance of the gate of first switch 310 ($C_{loadP}$) and load capacitance of the gate of second switch 315 ($C_{loadN}$) are substantially the same (e.g., $C_{load}$), then the voltage may equalize at ½(VCC–VSS), from VCC across the gate of first switch 310 to ½(VCC–VSS), and from VSS across the gate of second switch 315 to ½(VCC–VSS). Where VSS=0, then the voltage may equalize to ½VCC in some examples.

At $t_2$, a JOIN signal 415 may transition from high to low, decoupling GP node 330 from GN node 335.

At a time between $t_0$ and $t_3$, ENABLE signal 410 may transition from low to high. Although shown as occurring at $t_1$ in timing diagram 400, once DRIVE signal 405 transitions from high to low, disabling each of first gate driver 320 and second gate driver 325, ENABLE signal 410 may transition at any time between $t_0$ and $t_3$ because first gate driver 320 is disabled, such that the transition of ENABLE signal 410 from low to high may be isolated from the output of the first gave driver until DRIVE signal 405 transitions from low to high to enable first gate driver 320. As such the transition of ENABLE signal 410 may occur before or after $t_1$ within the time between t0 and $t_3$.

At $t_3$, DRIVE signal 405 may transition from low to high, enabling (e.g., activating) first gate driver 320 and second gate driver 325. Because ENABLE signal 410 was previously transitioned from low to high, the transition of DRIVE signal 405 may drive the output of first gate driver 320 low, and thus GP node 330 from the equilibrium voltage point (e.g., ½(VCC–VSS) or ½VCC as discussed above) to low (e.g., VSS), as illustrated by GP waveform 425, activating first gate driver 320 and thereby connecting power domain component 305 to VCC of the power source (seen as VCCZ at power domain component 305). As the output of first gate driver 320 transitions from high to low, the output of second gate driver 325 may be driven high, and thus GN node 335 from the equilibrium voltage point (e.g., ½(VCC–VSS) or ½VCC as discussed above) to high (e.g., VCC), as illustrated by GN waveform 420, activating second gate driver 325 and thereby connecting power domain component 305 to VSS of the power source (seen as VSSZ at power domain component 305). With both first switch 310 and second switch 315 activated, power domain component 305 may then operate in an active state (e.g., power domain active).

With the usage of pass gate 340 to transfer energy between switch gates, the transition from an inactive state (power down) prior to t0 to an active state (power domain active) following $t_3$ (an OFF-ON cycle) may use an amount of energy less than a corresponding procedure in which pass gate 340 is not used. Where the load capacitance of the gate of first switch 310 and load capacitance of the gate of second switch 315 are substantially the same (e.g., $C_{load}$) or the same, the OFF-ON transition using pass gate 340 as described with reference to FIGS. 3 and 4 may consume an amount of energy of substantially $C_{load} \cdot V^2$, where V=VCC–VSS. In contrast, an equivalent procedure without the use of pass gate 340 may consume an amount of energy of substantially $2 \cdot C_{load} \cdot V^2$.

If the load capacitance of the gate of first switch 310 ($C_{loadP}$) and load capacitance of the gate of second switch 315 ($C_{loadN}$) are different, the energy consumed by the OFF-ON transition without the use of pass gate 340 will also be reduced by the use of pass gate 340 by about one-half.

At a time when power domain component 305 is operating in the active state, a device (e.g., a host device) managing the active and inactive states of power domain component 305 may determine that power domain component 305 is to be deactivated. In some examples, a host device may provide an indication to deactivate (e.g., inactivate) power domain component 305. In some examples, such as where power domain component 305 is all or at least a portion of memory device 110 (e.g., all or part of a memory die 160, all or part of memory die 200), the host device may be an example of a component of system 100, such as the external memory controller 105, device memory controller 155, or a local memory controller 165, or a local memory controller 265. In some example, the host device may provide a command to transition the power domain component 305 to an inactive state from an active state (or to an active state from an inactive state). In some examples, the command may be to transition multiple power domain components, which may include power domain component 305.

In other examples, the host device may send a command to transition to a power down state, or other lower-power mode that is less power consuming than the active state (e.g., in an active or awake mode). Such command may be received by a controller that provides indications to transition at least some if not each of multiple power domain components between active and inactive states. In some examples, all such power domain components may be deactivated by the indications. In some examples, a subset of the power domain components may be deactivated, while other power domain components remain active. In yet other examples, a subset of the power domain components may be deactivated, while another subset of the power domain components may be activated, for example where the activated power domain components are less power consuming than the deactivated power domain components). In some examples, such as where power domain component 305 is all or at least a portion of memory device 110 (e.g., all or part of a memory die 160), the host device may be an example of a component of system 100, such as the external memory controller 105, device memory controller 155, or a local memory controller 165, and the controller may be a different one of the components of system 100, such as the external memory controller 105, device memory controller 155, or a local memory controller 165. The controller may provide an ACTIVE signal 630, as described with reference to FIGS. 5 and 6 herein, that generates ENABLE signal 410 corresponding to a power domain component (e.g., power domain component 305).

In some examples, once the host device determines that power domain component 305 is to be deactivated, at $t_4$, the controller (e.g., a controller of the memory device such as a device memory controller, for example device memory controller 155, or a local memory controller, for example local memory controller 165) may provide the DRIVE signal 405 that may be transitioned from high to low, disabling each of first gate driver 320 and second gate driver 325, such that the output of first gate driver 320 is floating (e.g., in a high impedance state) with respect to the input (e.g., the ENABLE signal 410), and the output of second gate driver 325 is floating (e.g., in a high impedance state) with respect to the input (e.g., GP node 330). In other examples, the controller may provide a signal that is used by circuitry local to the power domain switching circuit to generate the DRIVE signal 405. DRIVE signal 405 may be transitioned from high to low to disable the first gate driver 320 and the second gate driver 325 to prevent contention with the pass gate 340, for example at $t_1$ when the JOIN signal 415 transitions from low to high.

At $t_5$, JOIN signal 415 may transition from low to high, shorting together GP node 330 and GN node 335 via pass gate 340. Charge is transferred between the gate of first switch 310 and the gate of second switch 315 until the voltages equalize (or substantially equalize), in some examples, while in other examples the voltages may merely move toward each other. For example, if the load capacitance of the gate of first switch 310 ($C_{loadP}$) and load capacitance of the gate of second switch 315 ($C_{loadN}$) are the same (e.g., $C_{load}$), then the voltage may equalize at ½(VCC−VSS), from VSS across the gate of first switch 310 to ½(VCC−VSS), and from VCC across the gate of second switch 315 to ½(VCC−VSS). Where VSS=0, then the voltage may equalize to ½VCC.

At $t_6$, JOIN signal 415 transitions from high to low, decoupling GP node 330 from GN node 335.

At a time between $t_4$ and $t_7$, ENABLE signal 410 may transition from high to low. Although shown as occurring at $t_5$ in timing diagram 400, once DRIVE signal 405 transitions from high to low, disabling each of first gate driver 320 and second gate driver 325, ENABLE signal 410 may transition at any time between $t_4$ and $t_7$ because first gate driver 320 is disabled, such that the transition of ENABLE signal 410 from high to low may be isolated from the output of the first gate driver until DRIVE signal 405 transitions from low to high to enable first gate driver 320. As such the transition of ENABLE signal 410 may occur before or after $t_5$ within the time between $t_4$ and $t_7$.

At $t_7$, DRIVE signal 405 may transition from low to high, enabling (activating) first gate driver 320 and second gate driver 325. Because ENABLE signal 410 was previously transitioned from high to low, the transition of DRIVE signal 405 may drive the output of first gate driver 320 high, and thus GP node 330 from the equilibrium voltage point (e.g., ½(VCC−VSS) or ½VCC as discussed above) to high (e.g., VCC), as illustrated by GP waveform 425, deactivating first gate driver 320 and thereby disconnecting (e.g., isolating) power domain component 305 from VCC of the power source. As the output of first gate driver 320 transitions from low to high, the output of second gate driver 325 may be driven low, and thus GN node 335 from the equilibrium voltage point (e.g., ½(VCC−VSS) or ½VCC as discussed above) to low (e.g., VSS), as illustrated by GN waveform 420, deactivating second gate driver 325 and thereby disconnecting (e.g., isolating) power domain component 305 from VSS of the power source. With both first switch 310 and second switch 315 deactivated, power domain component 305 may then be in an inactive state (e.g., power down).

With the usage of pass gate 340 to transfer energy between switch gates, the transition from an active state prior to $t_4$ to an inactive state following $t_7$ (an ON-OFF cycle) may use an amount of energy less than a corresponding procedure in which pass gate 340 is not used. Where the load capacitance of the gate of first switch 310 and load capacitance of the gate of second switch 315 are substantially the same (e.g., $C_{load}$), or the same, the ON-OFF transition using pass gate 340 as described with reference to FIGS. 3 and 4 may consume an amount of energy of substantially $C_{load} \cdot V^2$, where V=VCC−VSS. In contrast, an equivalent procedure without the use of pass gate 340 may consume an amount of energy of substantially $2 \cdot C_{load} \cdot V^2$.

Like the OFF-ON transition, if the load capacitance of the gate of first switch 310 ($C_{loadP}$) and load capacitance of the gate of second switch 315 ($C_{loadN}$) are different, the energy consumed by the ON-OFF transition without the use of pass gate 340 will also be reduced by the use of pass gate 340 by about one-half.

Figure 5:
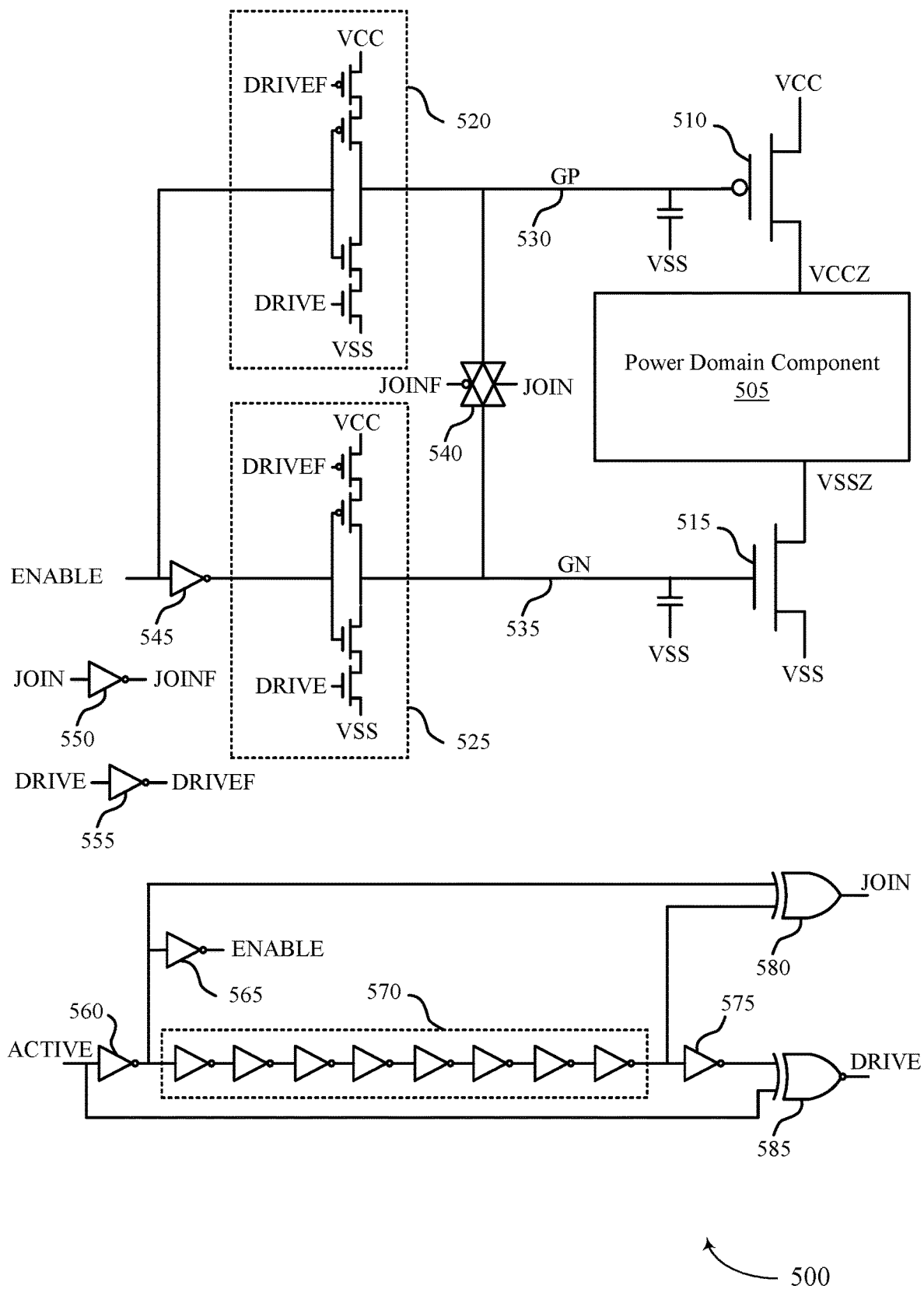
FIG. 5 illustrates an example of a power domain switching circuit that supports power domain switches for switching power reduction in accordance with examples as disclosed herein.

FIG. 5 illustrates an example of a power domain switching circuit 500 that supports power domain switches for switching power reduction in accordance with examples as disclosed herein. Power domain component 505, which may also be referred to as a power domain block, may be any collection or set of circuits that is supplied with power (e.g., from the power source) via first switch 510 and second switch 515, and may include multiple different components or blocks so supplied.

Power domain switching circuit 500 may include, in some examples, a first switch 510, a second switch 515, a pass gate 540, a first gate driver 520, and a second gate driver 525. First switch 510 may be configured to couple the power domain component 505 to a power source supplying VCC at a first terminal of a device that includes power domain switching circuit 500. Second switch 515 may be configured to couple the power domain component 505 to a power source supplying VSS at a second terminal of the device that includes power domain switching circuit 500. Due to the voltage drop across first switch 510 when in an activated state, power domain component 505 may receive VCCZ. Similarly, due to the voltage drop across second switch 515 when in an activated state, power domain component 505 may receive VSSZ.

First switch 510 may in some examples be a p-type FET. Second switch 515 may in some examples be a n-type FET. Each of first switch 510 and second switch 515 may have a relatively large gate width to minimize the voltage drop between source and drain while in an activated state supplying power from the power source, for example so that VCC may be close to VCCZ and VSS may be close to VSSZ. In some examples, first switch 510 and second switch 515 may be configured relative to each other to account for differences in electron and hole mobility. For example, first switch 510 may be p-type FET and have a gate that is two or more times as large as the gate of second switch 515. Because of the relatively large gate widths, first switch 510 and second switch 515 may each have a gate capacitance that is large relative to p-type FET and n-type FET transistors implemented for digital logic, memory, or other purposes in power domain component 505 (e.g., 2 or more orders of magnitude larger gate capacitance).

The gate of first switch 510 may, in some examples, be coupled to a first terminal of pass gate 540, an output of the first gate driver 520 via GP node 530. The gate of second switch 515 may, in some examples, be coupled to a second terminal of pass gate 540 and an output of the second gate driver 525 via GN node 535. When pass gate 540 is activated by a signal, such as a JOIN signal or a JOINF signal (e.g., the switch is closed), GP node 530 may be shorted to GN node 535, and consequently the gate of first switch 510 may be shorted to the gate of second switch 515. When pass gate 540 is deactivated, for example, by the JOIN and JOINF signals (e.g., the switch is opened), GP node 530 may be isolated from to GN node 535, and consequently the gate of first switch 510 may be isolated from the gate of second switch 515.

Pass gate 540 may be any gate that may connect (e.g., short) and disconnect (e.g., isolate) GP node 530 to and from GN node 535 according to one or more signals (e.g., a control signal or signals). In some examples, a single pass transistor may be used for pass gate 540, such as a single n-type FET or single p-type FET transistor, that may be controlled by a signal. In the example illustrated in power domain switching circuit 500, pass gate 540 is a transmission gate having an input, output, p-gate (receiving JOINF signal), and n-gate (receiving JOIN signal) and is used to provide bidirectional connectivity, where JOIN and JOINF may be complementary signals generated by inverter 550. Pass gate 540 may be scaled to increase or decrease current between GP node 530 and GN node 535.

First gate driver 520 may drive the gate of first switch 510 (via GP node 530) to activate or deactivate first switch 510. In some examples, first gate driver 520 is a three-state buffer whose output may be high, low, or floating (e.g., a high impedance state). The first input of first gate driver 520 may be activated or deactivated by an ENABLE signal and the enable input of first gate driver 520 may be activated or deactivated by a DRIVE signal for a first n-type FET gate and activated or deactivated by a DRIVEF signal for a first p-type FET gate. The DRIVEF signal may be generated by the use of inverter 555 receiving the DRIVE signal. First gate driver 520 may be supplied VCC and VSS from a power source.

Second gate driver 525 may drive the gate of second switch 515 (via GN node 535) to activate or deactivate second switch 515. In some examples, second gate driver 525 may be a three-state buffer whose output may be high, low, or floating (e.g., a high impedance state). The first input of second gate driver 525 may be the output of an inverter 545 that receives the ENABLE signal, and the enable input of first gate driver 520 may be activated or deactivated by a DRIVE signal for a first n-type FET gate and activated or deactivated by a DRIVEF signal for a first p-type FET gate. The DRIVEF signal may be generated by the use of inverter 555 receiving the DRIVE signal. The enable input of second gate driver 525 may be activated or deactivated by a DRIVE signal. Second gate driver 525 may be supplied VCC and VSS from the power source.

Inverter 560, inverter 565, inverter chain 570, inverter 575, XOR 580, and XNOR 585, may receive an ACTIVE signal and generate ENABLE, JOIN, and DRIVE signals used in other portions of power domain switching circuit 500.

Figure 6:
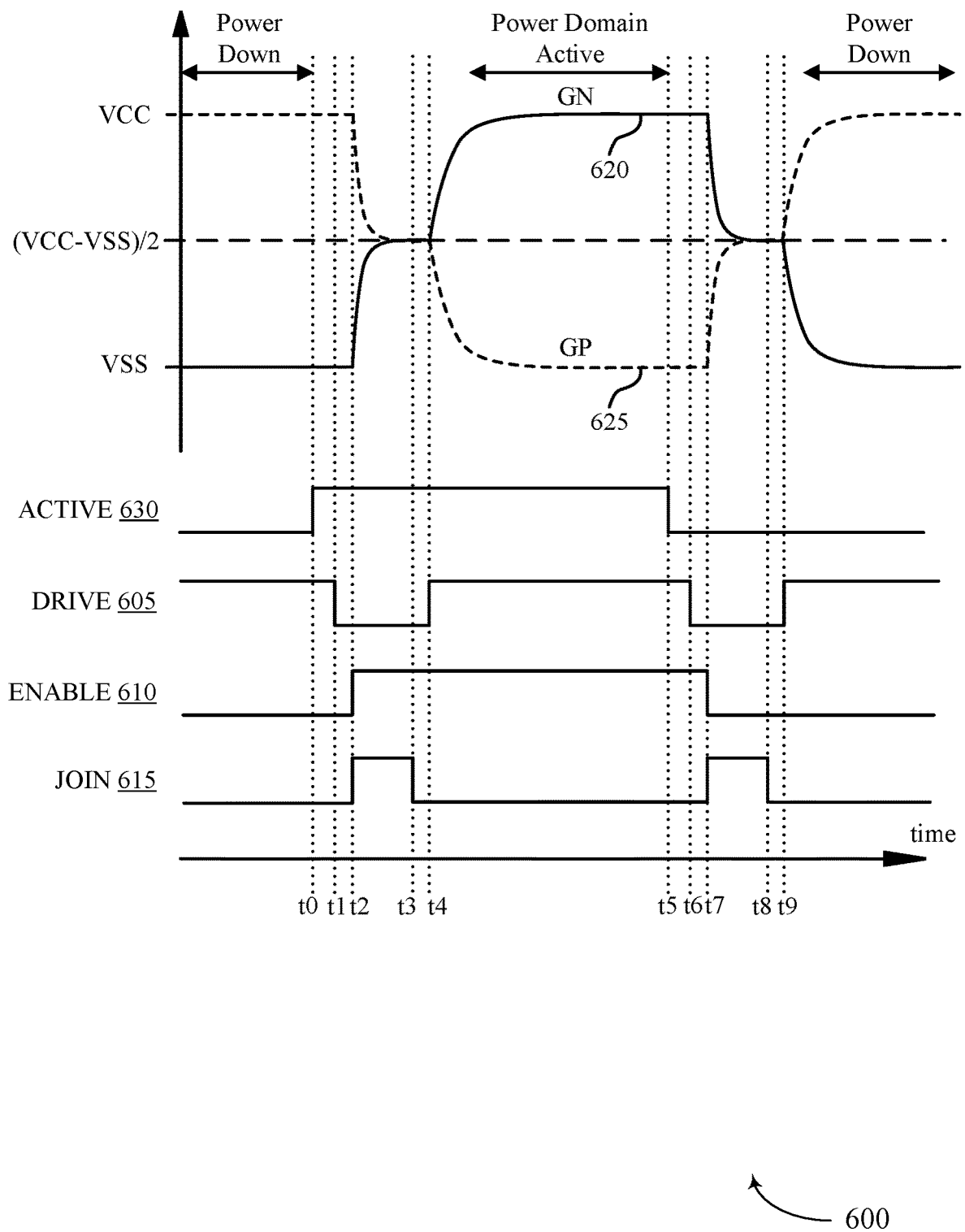
FIG. 6 illustrates an example of a timing diagram that supports power domain switches for switching power reduction in accordance with examples as disclosed herein.

FIG. 6 illustrates an example of a timing diagram 600 that supports power domain switches for switching power reduction in accordance with examples as disclosed herein. In some examples, timing diagram 600 may correspond to the operation of power domain switching circuit 500 as illustrated in and described with reference to FIG. 5. ACTIVE signal 630 may be used, for example when high, to indicate for the power domain component 505 to enter an active mode or, for example when low, to indicate for the power domain component 505 to enter a power down state (e.g., inactive or lower power state). DRIVE signal 605 may correspond to DRIVE signal that may activate or deactivate an input of first gate driver 520. ENABLE signal 610 may correspond to an ENABLE signal that may activate or deactivate an input of first gate driver 520. JOIN signal 615 may correspond to a JOIN signal that may activate or deactivate an input of pass gate 540. GN waveform 620 may correspond to a waveform of GN node 535. GP waveform 625 may correspond to a waveform of GP node 530.

Before to, the power domain switching circuit 500 may be in a first state such as an inactive state, which may also be referred to as power down. In the inactive state, each of first gate driver 520 and second gate driver 525 may be enabled by DRIVE signal 605 being high. ENABLE signal 610 held low at the input of first gate driver 520 may hold GP node 530 coupled to the gate of first switch 510 high at VCC. First switch 510 is thereby deactivated, decoupling (e.g., isolating) power domain component 505 from VCC of the power source. GP node 530 may be coupled to the input of second gate driver 525, such that ENABLE signal 610 held low at the input of first gate driver 520 may hold GP node 530 high, and second gate driver 525 may hold GN node 535 low at VSS. GN node 535 may be coupled to the gate of second switch 515, which is thereby deactivated, decoupling (e.g., isolating) power domain component 505 from VSS of the power source. Also, before to, JOIN signal 615 may be held low to decouple (isolate) GP node 530 and GN node 535, and ACTIVE signal 630 may also be held low.

At $t_0$, ACTIVE signal 630 may transition from low to high. A device (e.g., a host device) managing the active and inactive states of power domain component 505 may determine that power domain component 505 is to be activated. In some examples, the ACTIVE signal 630 (transitioning from low to high) may be generated from a memory command decoder upon receiving a command, such as a Exit-PowerDown or SLEEP_EXIT command. In some examples, a host device may provide an indication to activate power domain component 505. In some examples, such as where power domain component 505 is all or at least a portion of memory device 110 (e.g., all or part of a memory die 160, all or part of memory die 200), the host device may be an example of a component of system 100, such as the external memory controller 105, device memory controller 155, or a local memory controller 165, or a local memory controller 265. In some example, the host device may provide a command to transition the power domain component 505 between active and inactive states (e.g., to an inactive state from an active state, or to an active state from an inactive state). In some example, the command may be to transition multiple power domain components, which may include power domain component 505.

At $t_1$, DRIVE signal 605 may transition from high to low, disabling each of first gate driver 520 and second gate driver 525, such that the output of first gate driver 520 may be floating and the output of second gate driver 525 may be floating. DRIVE signal 605 may be transitioned from high to low to disable the first gate driver 520 and the second gate driver 525 to prevent contention with the pass gate 540, for example at $t_2$ (e.g., when the JOIN signal 615 transitions from low to high).

At $t_2$, JOIN signal 615 transitions from low to high, shorting together GP node 530 and GN node 535 via pass gate 540. In some cases, charge may be transferred between the gate of first switch 510 and the gate of second switch 515 until the voltages equalize (or substantially equalize), while in other examples the voltages may merely move toward each other. For example, if the load capacitance of the gate of first switch 510 ($C_{loadP}$) and load capacitance of the gate of second switch 515 ($C_{loadN}$) are substantially the same (e.g., $C_{load}$), or the same, then the voltage may equalize at ½(VCC−VSS), from VCC across the gate of first switch 510 to ½(VCC−VSS), and from VSS across the gate of second switch 515 to ½(VCC−VSS). Where VSS=0, then the voltage may equalize to ½VCC in some examples.

At $t_3$, a JOIN signal 615 transitions from high to low, decoupling GP node 530 from GN node 535.

At a time between $t_1$ and $t_4$, ENABLE signal 610 may transition from low to high. Although shown as occurring at $t_1$ in timing diagram 600, ENABLE signal 610 may transition at any time between $t_1$ and $t_4$ because first gate driver 520 is disabled.

At $t_4$, DRIVE signal 605 transitions from low to high, enabling (e.g., activating) first gate driver 520 and second gate driver 525. Because ENABLE signal 610 was previously transitioned from low to high, the transition of DRIVE signal 605 drives the output of first gate driver 520 low, and thus GP node 530 from the equilibrium voltage point (e.g., ½(VCC−VSS) or ½VCC as discussed above) to low (e.g., VSS), as illustrated by GP waveform 625, activating first gate driver 520 and thereby connecting power domain component 505 to VCC of the power source. The transition of DRIVE signal 605 from low to high drives the output of inverter 545 low, and thus the output of second gate driver 525 may be driven high, and thus GN node 535 from the equilibrium voltage point (e.g., ½(VCC−VSS) or ½VCC as discussed above) to high (e.g., VCC), as illustrated by GN waveform 620. This may activate second gate driver 525 and thereby connect power domain component 505 to VSS of the power source (seen as VSSZ at power domain component 505). With both first switch 510 and second switch 515 activated, power domain component 505 may then operate in an active state (e.g., power domain active).

With the usage of pass gate 540 to transfer energy between switch gates, the transition from an inactive state (e.g., power down) prior to $t_0$ to an active state (e.g., power domain active) following $t_4$ (e.g., an OFF-ON cycle) may use an amount of energy less than a corresponding procedure in which pass gate 540 is not used, for similar reasons as provided herein with reference to the use of pass gate 340 in power domain switching circuit 300.

At a time when power domain component 505 is operating in the active state following $t_4$, the device (e.g., the host device) managing the active and inactive states of power domain component 505 may determine that power domain component 505 is to be deactivated. In some examples, the ACTIVE signal 630 (e.g., transitioning from high to low) is generated from a memory command decoder upon receiving a PowerDown command (e.g., or SLEEP command). At $t_5$, ACTIVE signal 630 is transitioned from high to low to transition power domain component 505 to operate in an inactive state (e.g., power down state).

At $t_6$, DRIVE signal 605 transitions from high to low, disabling each of first gate driver 520 and second gate driver 525, such that the outputs of first gate driver 520 and second gate driver 525 may be floating (e.g., in high impedance states).

At $t_7$, JOIN signal 615 transitions from low to high, shorting GP node 530 and GN node 535 via pass gate 540. Charge is transferred between the gate of first switch 510 and the gate of second switch 515 until the voltages equalize (or substantially equalize), in some examples, while in other examples the voltages may merely move toward each other. For example, if the load capacitance of the gate of first switch 510 ($C_{loadP}$) and load capacitance of the gate of second switch 515 ($C_{loadN}$) are substantially the same (e.g., $C_{load}$), or the same, then the voltage may equalize at ½(VCC−VSS), from VS S across the gate of first switch 510 to ½(VCC−VSS), and from VCC across the gate of second switch 515 to ½(VCC−VSS). Where VSS=0, then the voltage may equalize to ½VCC.

At $t_8$, JOIN signal 615 transitions from high to low, decoupling GP node 530 from GN node 535.

At a time between $t_6$ and $t_9$, ENABLE signal 610 may transition from high to low. Although shown as occurring at $t_5$ in timing diagram 600, the transition of ENABLE signal 610 may occur before or after $t_7$ within the time between $t_6$ and $t_9$.

At $t_9$, DRIVE signal 605 transitions from low to high, enabling (e.g., activating) first gate driver 520 and second gate driver 525. Because ENABLE signal 610 was previously transitioned from high to low, the transition of DRIVE signal 605 drives the output of first gate driver 520 high, and thus GP node 530 from the equilibrium voltage point (e.g., ½(VCC−VSS) or ½VCC as discussed above) to high (e.g., VCC), as illustrated by GP waveform 625, deactivating first gate driver 520 and thereby disconnecting (e.g., isolating) power domain component 505 from VCC of the power source. The transition of DRIVE signal 605 also drives the output of second gate driver 525 low, and thus GN node 535 from the equilibrium voltage point (e.g., ½(VCC−VSS) or ½VCC as discussed above) to low (e.g., VSS), as illustrated by GN waveform 620, deactivating second gate driver 525 and thereby disconnecting (e.g., isolating) power domain component 505 from VSS of the power source. With both first switch 510 and second switch 515 deactivated, power domain component 505 may then be in an inactive state (e.g., a power down state).

With the usage of pass gate 540 to transfer energy between switch gates, the transition from an active state (e.g., power domain active) prior to $t_5$ to an inactive state (e.g., power down) following $t_9$ (e.g., an ON-OFF cycle) may use an amount of energy less than a corresponding procedure in which pass gate 540 is not used, for similar reasons as provided herein with reference to the use of pass gate 340 in power domain switching circuit 300.

Figure 7:
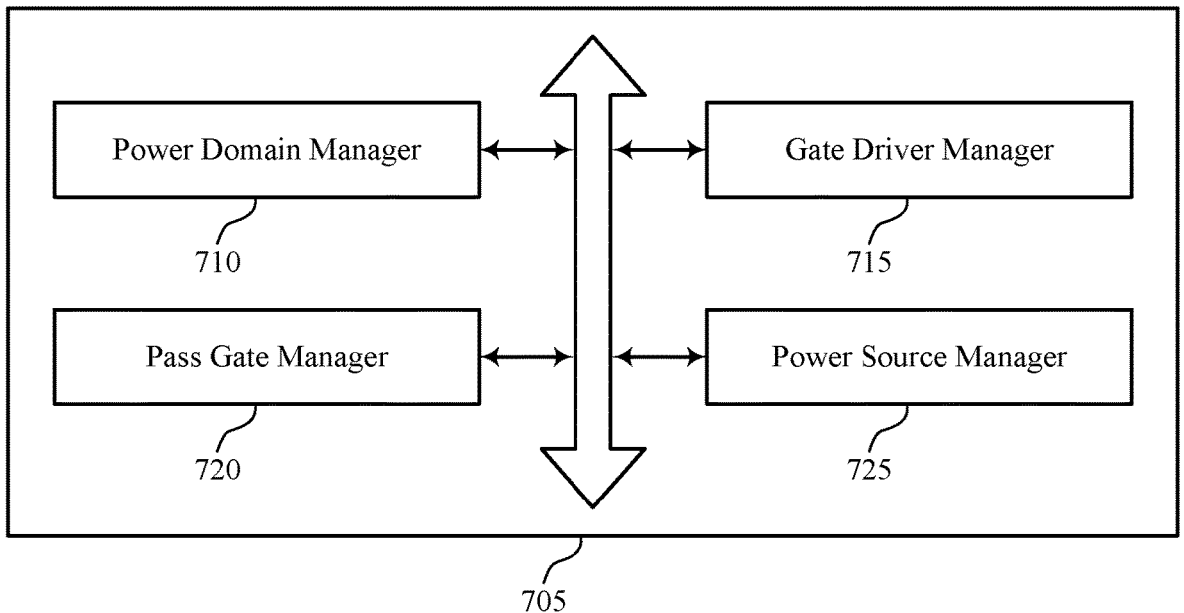
FIG. 7 shows a block diagram of a device that supports power domain switches for switching power reduction in accordance with aspects of the present disclosure.

FIG. 7 shows a block diagram 700 of a device 705 that supports power domain switches for switching power reduction in accordance with examples as disclosed herein. The device 705 may be an example of aspects of a memory device as described with reference to FIGS. 1 and 2. The device 705 may include a power domain manager 710, a gate driver manager 715, a pass gate manager 720, and a power source manager 725. Each of these modules may communicate, directly or indirectly, with one another (e.g., via one or more buses).

The power domain manager 710 may receive, from a host device, an indication to transition one or more power domain components from a first power state to a second power state.

In some examples, the power domain manager 710 may determine, based on receiving the indication, to transition a power domain component from an active state to an inactive state, the power domain component supplied with power from a power source via a first switch and a second switch during the active state.

In some examples, the power domain manager 710 may receive, from the host device, a command to transition from the active state to the inactive state. In some examples, the power domain manager 710 may determine to transition the power domain component from the inactive state to the active state. In some cases, the one or more power domain components include the power domain component. In some cases, the inactive state corresponds to a power down state for a device including the power domain component.

The gate driver manager 715 may float, during the transition of the power domain component, a first gate driver for the first switch and a second gate driver for the second switch. In some examples, the gate driver manager 715 may disable, while floating the first gate driver and the second gate driver, an input of the first gate driver to disable an input of the second gate driver. In some examples, the gate driver manager 715 may deactivate the first gate driver to float an output of the first gate driver, the output of the first gate driver coupled with a gate of the first switch. In some examples, the gate driver manager 715 may deactivate the second gate driver to float an output of the second gate driver, the output of the second gate driver coupled with a gate of the second switch. In some examples, deactivating the first gate driver includes deactivating a first three-state buffer to float an output of the first three-state buffer. In some examples, deactivating the second gate driver includes deactivating a second three-state buffer to float an output of the second three-state buffer. In some examples, the gate driver manager 715 may float, during the transition to the active state, the first gate driver for the first switch and the second gate driver for the second switch.

In some examples, the gate driver manager 715 may disconnect the power domain component from the power source by driving, after deactivating the pass gate, the first switch using the first gate driver and the second switch using the second gate driver. In some examples, the gate driver manager 715 may connect the power domain component to the power source by driving, after deactivating the pass gate, the first switch using the first gate driver and the second switch using the second gate driver.

The pass gate manager 720 may activate, during the transition of the power domain component and based on the floating, a pass gate to short the first switch and the second switch. In some examples, the pass gate manager 720 may activate a first input and a second input of a transmission gate to short the first switch and the second switch. In some examples, the pass gate manager 720 may activate the pass gate to short the first power domain switch and the second power domain switch.

In some examples, the pass gate manager 720 may deactivate the pass gate. In some examples, the pass gate manager 720 may deactivate the pass gate, after the activating, the pass gate.

The power source manager 725 may supply power from a power source to the power domain component during the active state via the first switch and the second switch.

Figure 8:
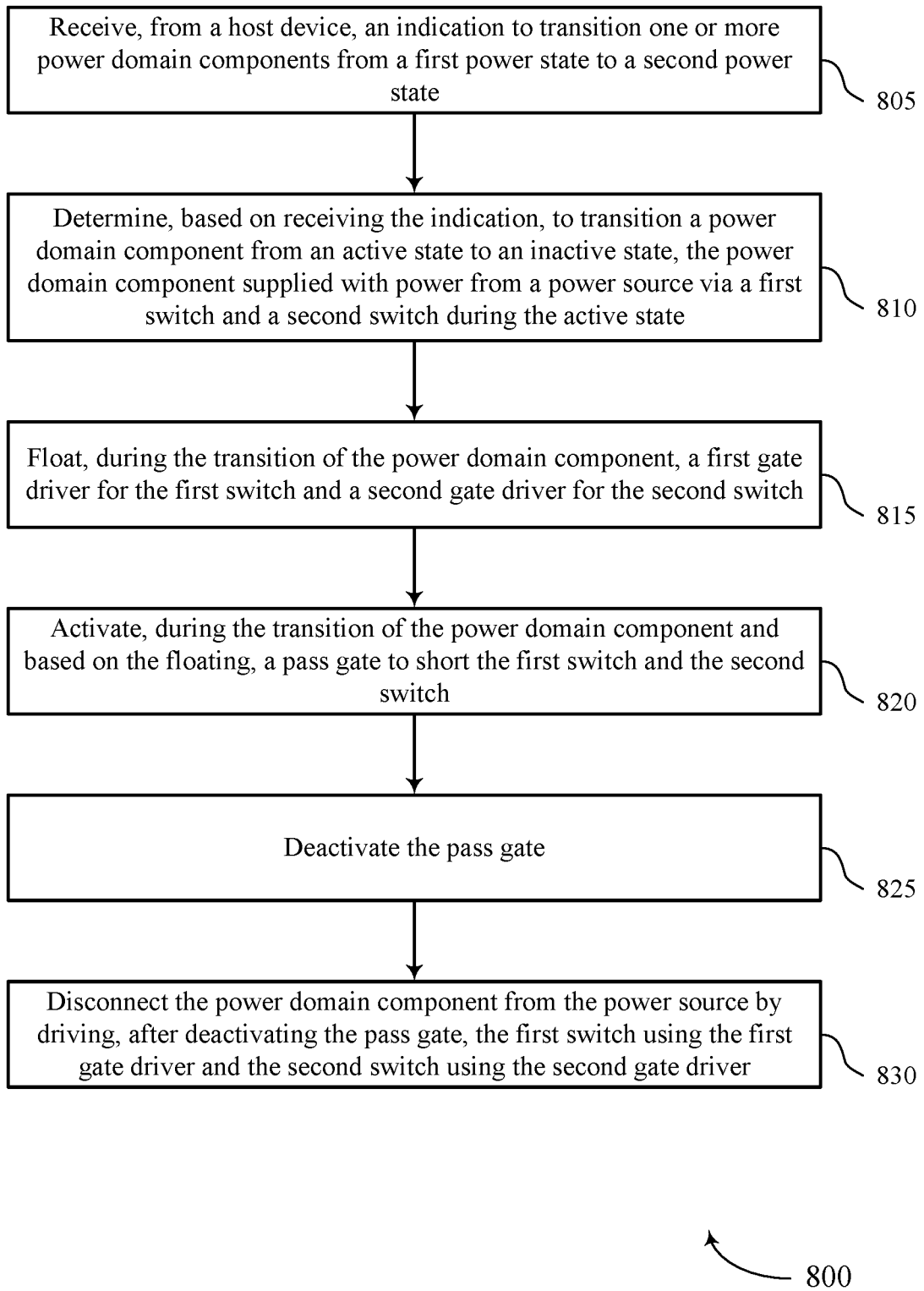
FIG. 8 shows a flowchart illustrating a method or methods that support power domain switches for switching power reduction in accordance with examples as disclosed herein.

FIG. 8 shows a flowchart illustrating a method or methods 800 that supports power domain switches for switching power reduction in accordance with aspects of the present disclosure. The operations of method 800 may be implemented by a device, for example a memory device or its components as described herein. For example, the operations of method 800 may be performed by a device as described with reference to FIG. 7. In some examples, a device may execute a set of instructions to control the functional elements of the device to perform the described functions. Additionally or alternatively, a device may perform aspects of the described functions using special-purpose hardware.

At 805, the device may receive, from a host device, an indication to transition one or more power domain components from a first power state to a second power state. The operations of 805 may be performed according to the methods described herein. In some examples, aspects of the operations of 805 may be performed by a power domain manager as described with reference to FIG. 7.

At 810, the device may determine, based on receiving the indication, to transition a power domain component from an active state to an inactive state, the power domain component supplied with power from a power source via a first switch and a second switch during the active state. The operations of 810 may be performed according to the methods described herein. In some examples, aspects of the operations of 810 may be performed by a power domain manager as described with reference to FIG. 7.

At 815, the device may float, during the transition of the power domain component, a first gate driver for the first switch and a second gate driver for the second switch. The operations of 815 may be performed according to the methods described herein. In some examples, aspects of the operations of 815 may be performed by a gate driver manager as described with reference to FIG. 7.

At 820, the device may activate, during the transition of the power domain component and based on the floating, a pass gate to short the first switch and the second switch. The operations of 820 may be performed according to the methods described herein. In some examples, aspects of the operations of 820 may be performed by a pass gate manager as described with reference to FIG. 7.

At 825, the device may deactivate the pass gate. The operations of 825 may be performed according to the methods described herein. In some examples, aspects of the operations of 825 may be performed by a pass gate manager as described with reference to FIG. 7.

At 830, the device may disconnect the power domain component from the power source by driving, after deactivating the pass gate, the first switch using the first gate driver and the second switch using the second gate driver. The operations of 830 may be performed according to the methods described herein. In some examples, aspects of the operations of 830 may be performed by a gate driver manager as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for receiving, from a host device, an indication to transition one or more power domain components from a first power state to a second power state, determining, based on receiving the indication, to transition a power domain component from an active state to an inactive state, the power domain component supplied with power from a power source via a first switch and a second switch during the active state, floating, during the transition of the power domain component, a first gate driver for the first switch and a second gate driver for the second switch, activating, during the transition of the power domain component and based on the floating, a pass gate to short the first switch and the second switch, deactivating the pass gate, and disconnecting the power domain component from the power source by driving, after deactivating the pass gate, the first switch using the first gate driver and the second switch using the second gate driver.

Some examples of the method 800 and the apparatus described herein may further include operations, features, means, or instructions for supplying power from a power source to the power domain component during the active state via the first switch and the second switch.

Some examples of the method 800 and the apparatus described herein may further include operations, features, means, or instructions for disabling, while floating the first gate driver and the second gate driver, an input of the first gate driver to disable an input of the second gate driver.

In some examples of the method 800 and the apparatus described herein, receiving the indication to transition the one or more power domain components from the first power state to the second power state may include operations, features, means, or instructions for receiving, from the host device, a command to transition from the active state to the inactive state.

In some examples of the method 800 and the apparatus described herein, the one or more power domain components include the power domain component.

In some examples of the method 800 and the apparatus described herein, activating the pass gate may include operations, features, means, or instructions for activating a first input and a second input of a transmission gate to short the first switch and the second switch.

In some examples of the method 800 and the apparatus described herein, floating the first gate driver for the first switch and the second gate driver for the second switch may include operations, features, means, or instructions for deactivating the first gate driver to float an output of the first gate driver, the output of the first gate driver coupled with a gate of the first switch, and deactivating the second gate driver to float an output of the second gate driver, the output of the second gate driver coupled with a gate of the second switch.

In some examples of the method 800 and the apparatus described herein, deactivating the first gate driver may include operations, features, means, or instructions for deactivating a first three-state buffer to float an output of the first three-state buffer, and deactivating the second gate driver may include operations, features, means, or instructions for deactivating a second three-state buffer to float an output of the second three-state buffer.

Some examples of the method 800 and the apparatus described herein may further include operations, features, means, or instructions for determining to transition the power domain component from the inactive state to the active state, floating, during the transition to the active state, the first gate driver for the first switch and the second gate driver for the second switch, activating the pass gate to short the first power domain switch and the second power domain switch, deactivating, after the activating, the pass gate, and connecting the power domain component to the power source by driving, after deactivating the pass gate, the first switch using the first gate driver and the second switch using the second gate driver.

In some examples of the method 800 and the apparatus described herein, the inactive state corresponds to a power down state for a device including the power domain component.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a power domain component, a first switch coupled with the power domain component and a first terminal and configured to be activated during an active state of the power domain component, the first terminal configured to be coupled with a power source, a second switch coupled with the power domain component and a second terminal and configured to be activated during the active state of the power domain component, the second terminal configured to be coupled with the power source, and a pass gate coupled with the first switch and the second switch and configured to short the first switch and the second switch during a transition of the power domain component between the active state and an inactive state.

Some examples of the apparatus may include a power source to supply power to the power domain component during the active state via the first terminal and the first switch and via the second terminal and the second switch.

Some examples of the apparatus may include a controller configured to receive an indication to transition one or more power domain components from a first power state to a second power state and to activate the pass gate in response to the indication.

In some examples, the indication includes a command to transition the one or more power domain components between the inactive state and the active state, and where the first power state includes the active state and the second power state includes the inactive state.

In some examples, the pass gate includes a transmission gate configured to short the first switch and the second switch for a first duration during the transition.

Some examples of the apparatus may include a first gate driver coupled with the first switch and the pass gate and configured to activate the first switch during the active state of the power domain component, and a second gate driver coupled with the second switch and the pass gate and configured to activate the second switch during the active state of the power domain component.

In some examples, the first gate driver includes a first three-state buffer, where an output of the first three-state buffer may be configured to be isolated from an input of the first three-state buffer during the transition, and the second gate driver includes a second three-state buffer, where an output of the second three-state buffer may be configured to be isolated from an input of the second three-state buffer during the transition.

An apparatus is described. The apparatus may include a first switch to couple a power domain component with a power source, a second switch to couple the power domain component with the power source, a pass gate coupled with the first switch and the second switch, a controller coupled with the pass gate and to cause the apparatus to, activate, based on the determining, the pass gate to short the first switch and the second switch, deactivate the pass gate after shorting the first switch and the second switch, and decouple, based on deactivating the pass gate, the power domain component from the power source.

Some examples of the apparatus may include a first gate driver coupled with the pass gate and the first switch and to drive the first switch, and a second gate driver coupled with the pass gate and the second switch and to drive the second switch.

Some examples may further include couple the power domain component to the power source by activating, during the active state of the power domain component, the first gate driver to drive the first switch and the second gate driver to drive the second switch, and decouple the power domain component from the power source by deactivating, during the inactive state of the power domain component, the first gate driver and the second gate driver.

Some examples may further include disable, while floating the first gate driver and the second gate driver, an input of the first gate driver to disable an input of the second gate driver.

Some examples of the apparatus may include a power source to supply power to the power domain component during the active state via the first switch and the second switch, where the controller may be configured to cause the apparatus to.

Some examples may further include receiving, from a host device, a command to transition the power domain component from the first power state to the second power state, and determine to transition the power domain component from the first power state to the second power state at least in part in response to the command.

Some examples may further include activating the pass gate by being operable to activate a first input and a second input of a transmission gate to short the first switch and the second switch, the pass gate including the transmission gate.

Some examples may further include determining to transition the power domain component from the second power state to the first power state, activate, based on the determining, the pass gate for a second duration to short the first switch and the second switch, deactivate the pass gate after the second duration, and couple, based on deactivating the pass gate, the power domain component to the power source.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

As used herein, the term "shorting" refers to a relationship between components in which a conductive path is established between the components via the activation of one or more intermediary components between the two components in question. For example, a first component shorted to a second component may exchange signals with the second component when a switch between the two components is closed. In another example, a first component shorted to a second component may exchange signals with the second component when a gate (e.g., a pass gate or a transmission gate) between the two components is activated. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
  receiving, from a host device, an indication to transition one or more power domain components from a first power state to a second power state;
  determining, based at least in part on receiving the indication, to transition a power domain component from an active state to an inactive state, the power domain component supplied with power from a power source via a first switch and a second switch during the active state;
  floating, during the transition of the power domain component, a first gate driver for the first switch and a second gate driver for the second switch;
  activating, during the transition of the power domain component and based at least in part on the floating, a pass gate to short the first switch and the second switch;
  deactivating the pass gate; and
  disconnecting the power domain component from the power source by driving, after deactivating the pass gate, the first switch using the first gate driver and the second switch using the second gate driver.

2. The method of claim 1, further comprising:
  supplying power from the power source to the power domain component during the active state via the first switch and the second switch.

3. The method of claim 1, further comprising:
  disabling, while floating the first gate driver and the second gate driver, an input of the first gate driver to disable an input of the second gate driver.

4. The method of claim 1, wherein receiving the indication to transition the one or more power domain components from the first power state to the second power state comprises:
receiving, from the host device, a command to transition from the active state to the inactive state.

5. The method of claim 1, wherein the one or more power domain components comprise the power domain component.

6. The method of claim 1, wherein floating the first gate driver for the first switch and the second gate driver for the second switch comprises:
deactivating the first gate driver to float an output of the first gate driver, the output of the first gate driver coupled with a gate of the first switch; and
deactivating the second gate driver to float an output of the second gate driver, the output of the second gate driver coupled with a gate of the second switch.

7. The method of claim 1, further comprising:
determining to transition the power domain component from the inactive state to the active state;
floating, during the transition to the active state, the first gate driver for the first switch and the second gate driver for the second switch;
activating the pass gate to short the first switch and the second switch;
deactivating, after the activating, the pass gate; and
connecting the power domain component to the power source by driving, after deactivating the pass gate, the first switch using the first gate driver and the second switch using the second gate driver.

8. The method of claim 1, wherein the inactive state corresponds to a power down state for a device comprising the power domain component.

9. An apparatus, comprising:
a power domain component;
a first switch coupled with the power domain component, a first terminal, and a first gate driver, and configured to be activated during an active state of the power domain component, the first terminal configured to be coupled with a power source, and the first gate driver configured to float during a transition of the power domain component to the active state;
a second switch coupled with the power domain component and a second terminal and configured to be activated during the active state of the power domain component, the second terminal configured to be coupled with the power source; and
a pass gate coupled with the first switch and the second switch and configured to short the first switch and the second switch during a transition of the power domain component between the active state and an inactive state.

10. The apparatus of claim 9, further comprising:
the power source to supply power to the power domain component during the active state via the first terminal and the first switch and via the second terminal and the second switch.

11. The apparatus of claim 9, further comprising:
a controller configured to receive an indication to transition one or more power domain components from a first power state to a second power state and to activate the pass gate in response to the indication.

12. The apparatus of claim 9, further comprising:
the first gate driver coupled with the first switch and the pass gate and configured to activate the first switch during the active state of the power domain component; and
a second gate driver coupled with the second switch and the pass gate and configured to activate the second switch during the active state of the power domain component.

13. An apparatus, comprising:
a power domain component;
a first switch coupled with the power domain component and a first terminal and configured to be activated during an active state of the power domain component, the first terminal configured to be coupled with a power source;
a second switch coupled with the power domain component and a second terminal and configured to be activated during the active state of the power domain component, the second terminal configured to be coupled with the power source;
a pass gate coupled with the first switch and the second switch and configured to short the first switch and the second switch during a transition of the power domain component between the active state and an inactive state;
a first gate driver coupled with the first switch and the pass gate and configured to activate the first switch during the active state of the power domain component, wherein the first gate driver comprises a first three-state buffer, and wherein an output of the first three-state buffer is configured to be isolated from an input of the first three-state buffer during the transition; and
a second gate driver coupled with the second switch and the pass gate and configured to activate the second switch during the active state of the power domain component, wherein the second gate driver comprises a second three-state buffer, wherein an output of the second three-state buffer is configured to be isolated from an input of the second three-state buffer during the transition.

14. An apparatus, comprising:
a first switch to couple a power domain component with a power source via a first gate driver;
a second switch to couple the power domain component with the power source via a second gate driver;
a pass gate coupled with the first switch and the second switch; and
a controller coupled with the pass gate and to cause the apparatus to:
determine to transition the power domain component from a first power state to a second power state;
float the first gate driver for the first switch and the second gate driver for the second switch;
activate, based at least in part on the determining, the pass gate to short the first switch and the second switch;
deactivate the pass gate after shorting the first switch and the second switch; andl
decouple, based at least in part on deactivating the pass gate, the power domain component from the power source.

15. The apparatus of claim 14, further comprising:
the first gate driver coupled with the pass gate and the first switch and to drive the first switch; and
the second gate driver coupled with the pass gate and the second switch and to drive the second switch.

16. The apparatus of claim 14, further comprising:
the power source to supply power to the power domain component during an active state via the first switch and the second switch, wherein the controller is configured to cause the apparatus to:
couple the power domain component to the power source via the first switch and a first terminal; and
couple the power domain component to the power source via the second switch and a second terminal.

17. The apparatus of claim 14, wherein the controller is configured to cause the apparatus to:
receive, from a host device, a command to transition the power domain component from the first power state to the second power state; and
determine to transition the power domain component from the first power state to the second power state at least in part in response to the command.

18. The apparatus of claim 14, wherein the controller is further operable to cause the apparatus to:
determine to transition the power domain component from the second power state to the first power state;
activate, based at least in part on the determining, the pass gate for a second duration to short the first switch and the second switch;
deactivate the pass gate after the second duration; and
couple, based at least in part on deactivating the pass gate, the power domain component to the power source.

19. An apparatus, comprising:
a first switch to couple a power domain component with a power source;
a second switch to couple the power domain component with the power source;
a pass gate coupled with the first switch and the second switch;
a first gate driver coupled with the pass gate and the first switch and to drive the first switch;
a second gate driver coupled with the pass gate and the second switch and to drive the second switch; and
a controller coupled with the pass gate, the first gate driver, and the second gate driver and operable to cause the apparatus to:
determine to transition the power domain component from a first power state to a second power state;
couple the power domain component to the power source by activating, during an active state of the power domain component, the first gate driver to drive the first switch and the second gate driver to drive the second switch;
activate, based at least in part on the determining, the pass gate to short the first switch and the second switch;
deactivate the pass gate after shorting the first switch and the second switch; and
decouple, based at least in part on deactivating the pass gate, the power domain component from the power source by deactivating, during an inactive state of the power domain component, the first gate driver and the second gate driver.

20. An apparatus, comprising:
a first switch to couple a power domain component with a power source;
a second switch to couple the power domain component with the power source;
a pass gate coupled with the first switch and the second switch;
a first gate driver coupled with the pass gate and the first switch and to drive the first switch;
a second gate driver coupled with the pass gate and the second switch and to drive the second switch; and
a controller coupled with the pass gate, the first gate driver, and the second gate driver, and operable to cause the apparatus to:
determine to transition the power domain component from a first power state to a second power state;
activate, based at least in part on the determining, the pass gate to short the first switch and the second switch;
disable, while floating the first gate driver and the second gate driver, an input of the first gate driver to disable an input of the second gate driver;
deactivate the pass gate after shorting the first switch and the second switch; and
decouple, based at least in part on deactivating the pass gate, the power domain component from the power source.

* * * * *